United States Patent
Komatsu

[11] Patent Number: 5,933,018
[45] Date of Patent: *Aug. 3, 1999

[54] LIQUID CRYSTAL DISPLAY PANEL INSPECTION DEVICE AND METHOD FOR MANUFACTURING SAME

[75] Inventor: Hiroto Komatsu, Omiya, Japan

[73] Assignee: Shin-Etsu Polymer Co., Ltd., Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/677,726

[22] Filed: Jul. 8, 1996

[30] Foreign Application Priority Data

Aug. 29, 1995 [JP] Japan ................................ 7-242298

[51] Int. Cl.⁶ ..................... G01R 31/02; G01R 31/00; G02F 1/1345; H01R 9/09
[52] U.S. Cl. .................... 324/755; 345/904; 349/150; 439/67; 324/770
[58] Field of Search ................... 349/149, 150, 349/152, 58, 60; 248/542; 345/87, 205, 206, 904; 324/755, 770, 757, 754, 756; 439/66, 67, 68, 69, 70, 65; 348/92

[56] References Cited

U.S. PATENT DOCUMENTS

| | | | |
|---|---|---|---|
| 3,832,632 | 8/1974 | Ardezzone | 324/756 |
| 4,019,798 | 4/1977 | Zielinski | 439/67 |
| 4,060,889 | 12/1977 | Zielinski | 439/67 |
| 4,473,798 | 9/1984 | Cedrone et al. | 324/754 |
| 4,531,793 | 7/1985 | Hochgesang | 439/67 |
| 4,690,510 | 9/1987 | Takamatsu et al. | 349/150 |
| 4,766,371 | 8/1988 | Moriya | 439/66 |
| 4,862,153 | 8/1989 | Nakatani et al. | 349/150 |
| 4,871,964 | 10/1989 | Boll et al. | 324/754 |
| 4,899,099 | 2/1990 | Mendenhall et al. | 324/754 |
| 4,938,702 | 7/1990 | English | 439/67 |
| 4,943,768 | 7/1990 | Niki et al. | 324/754 |
| 5,209,671 | 5/1993 | Sugimoto | 439/67 |
| 5,304,922 | 4/1994 | Betz et al. | 324/754 |
| 5,404,239 | 4/1995 | Hirai | 349/150 |
| 5,671,029 | 9/1997 | Haruki | 349/149 |
| 5,801,542 | 9/1998 | Kajiwara et al. | 324/755 |

FOREIGN PATENT DOCUMENTS

| | | |
|---|---|---|
| 0 331 282 A1 | 9/1989 | European Pat. Off. . |
| 0 613 014 A1 | 8/1994 | European Pat. Off. . |
| 07225245 | 8/1995 | Japan . |
| 2 239 744 | 7/1991 | United Kingdom . |

OTHER PUBLICATIONS

Patent Abstracts of Japan, vol. 7, No. 7 (E–170), Apr. 12, 1983, JP 58–15245 A (Suwa Seikosha K.K.) Jan. 28, 1983, abstract.

Patent Abstracts of Japan, vol. 17, No. 474 (P–1602), Aug. 27, 1993, JP 5–113460 A) Tokyo Electron Yamanashi K.K.) May 7, 1993, abstract.

*Primary Examiner*—Jeffery Brier
*Assistant Examiner*—Paul A. Bell
*Attorney, Agent, or Firm*—Lerner, David, Littenberg, Krumholz, Mentlik, LLP

[57] ABSTRACT

A liquid crystal display panel inspection device capable of reducing a manufacturing cost and significantly reducing intervals or pitches between connection wires and a method for manufacturing the same. The device includes a panel holder formed with a mounting hole in which a liquid crystal display panel is mounted and electrodes arranged around the mounting hole on one surface of the panel holder. Also, it includes connection wires of a dog-legged shape each connected at one end thereof to one of the electrodes of the panel holder and arranged so as to extend into the mounting hole. The connection wires are each formed at the other end thereof with a terminal, which is rendered abuttable against one of the electrodes of the liquid crystal display panel. The panel holder is mounted on the other surface thereof with a holding plate for selectively closing the mounting hole. The holding plate functions to pressedly contact the electrodes of the liquid crystal display panel and the terminals of the connection wires with each other.

23 Claims, 6 Drawing Sheets

LIQUID CRYSTAL DISPLAY PANEL INSPECTION DEVICE AND METHOD FOR MANUFACTURING SAME

BACKGROUND OF THE INVENTION

This invention relates to a liquid crystal display panel inspection device used for a final inspection or the like which is carried out on a liquid crystal display panel in an array step, a cell step, a module step or the like in a production line of a liquid crystal display panel and a method for manufacturing the same, and more particularly to a liquid crystal display panel inspection device which is suitable for inspecting a liquid crystal display panel having electrodes arranged at fine pitches therein and adapted to accomplish the inspection at a reduced cost and a method for manufacturing the same.

A production line of a liquid crystal display panel includes an array step, a cell step, a module step and the like, in each of which a liquid crystal display panel inspection device is used for inspecting or checking electrical characteristics of a liquid crystal display panel, picture quality thereof and the like, so that any defective product is removed from the line to increase production efficiency. A liquid crystal display panel inspection device which has been conventionally used for this purpose includes a panel holder provided with a holding section for detachably holding a liquid crystal display panel and a plurality of spring probes (pogo pins) arranged at a periphery of the holding section so that the spring probes are abutted against electrodes of a liquid crystal display panel mounted in the holding section for inspection.

Unfortunately, the conventional liquid crystal display panel inspection device has the disadvantages of causing an increase in a manufacturing cost of the device because of using the spring probes and rendering the inspection difficult and troublesome because of causing pitches between the electrodes to be reduced.

In particular, the latter problem of rendering the inspection troublesome is disadvantageously amplified in inspection of a color liquid crystal display panel and a liquid crystal display panel of high resolution. More particularly, electrodes of a color liquid crystal display panel are arranged at pitches one third as large as those of a monochromatic liquid crystal display panel and a liquid crystal display panel of an SVGA standard has a resolution of 800×600 pixels, which is increased as compared with that of 640×480 pixels of a liquid crystal display panel of a VGA standard. Thus, it is highly desired to solve the problem due to an increase in the demand for a color liquid crystal display panel and a high-resolution liquid crystal display panel. The current technological level fails to reduce electrode pitches to a level below 50 $\mu$m, because of being restricted by a TAB substrate for a drive IC and the like.

SUMMARY OF THE INVENTION

The present invention has been made in view of the foregoing disadvantages of the prior art.

Accordingly, it is an object of the present invention to provide a liquid crystal display panel inspection device which is capable of effectively inspecting a liquid crystal display panel having electrodes arranged at reduced pitches therein.

It is another object of the present invention to provide a liquid crystal display panel inspection device which is capable of significantly reducing a manufacturing cost.

It is a further object of the present invention to provide a method for manufacturing a liquid crystal display panel inspection device which is capable of providing a liquid crystal display panel inspection device accomplishing the above-described objects.

In accordance with one aspect of the present invention, a liquid crystal display panel inspection device is provided. The liquid crystal display panel inspection device includes a panel holder formed with a holding section constructed so as to be mounted therein with a liquid crystal display panel provided with electrodes, a printed circuit board arranged at a peripheral edge of the holding section of the panel holder and having electrodes formed thereon, connection wires each connected to one of the electrodes of the printed circuit board in a manner to elastically bendably extend to the holding section and provided at a distal end thereof with a terminal in a manner to be abuttable against one of the electrodes of the liquid crystal display panel, and an elastic member for sealing within each of the connection wires except each of the terminals thereof.

Such construction of the present invention eliminates the arrangement of inherently expensive spring probes, to thereby reduce a manufacturing cost and significantly reduces intervals or pitches between the connection wires, to thereby facilitate inspection of a liquid crystal display panel having reduced electrode pitches.

In a preferred embodiment of the present invention, the printed circuit board comprises a multi-layer board having the electrodes laminated thereon, wherein the electrodes on layers of the multi-layer board are exposed in a step-like manner on one side of the multi-layer board and each connected at an exposed portion thereof to one of the connection wires.

Such construction permits connection of the connection wires to be accomplished at reduced intervals, to thereby facilitate inspection of a liquid crystal display panel further reduced in electrode pitches.

In a preferred embodiment of the present invention, the connection wires are each connected at an end thereof in an offset manner to the printed circuit board.

Such construction likewise permits connection of the connection wires to be accomplished at reduced intervals, to thereby facilitate inspection of a liquid crystal display panel further reduced in electrode pitches.

In a preferred embodiment of the present invention, the device further includes a holding plate detachably mounted on the panel holder to force the liquid crystal display panel toward the terminals of the connection wires. The holding plate may be provided on an inner surface thereof with a second elastic member adapted to abut with the liquid crystal display panel. Furthermore, the holding plate may include second electrodes and second connection wires each provided at a distal end thereof with a second terminal in a manner to be abuttable against one of the electrodes arranged on a lower surface of the liquid crystal display panel.

In a preferred embodiment of the present invention, the electrodes of the printed circuit board are each formed into a strip-like shape having an enlarged portion increased in width and arranged in a step-like manner, at which enlarged portion one of the connection wires is connected to one of the electrodes of the printed circuit board.

In a preferred embodiment of the present invention, each of the terminals of the connection wires includes a contact portion made of hard metal and adapted to abut against one of the electrodes of the liquid crystal display panel. The terminals of the connection wires may be arranged in an offset manner.

The printed circuit board may be made of epoxy resin, ceramics or the like as in the prior art. A plurality of such printed circuit boards may be assembled together to provide the panel holder.

The connection wires may each be made of, for example, a fine gold wire or the like so as to permit wire bonding of the connection wire to be accomplished. A diameter of the connection wire is determined depending on electrode pitches of the liquid crystal display panel to be inspected or the like. In general, the connection wire may be formed with a diameter of about 25 µm.

The elastic member may be made of an insulating resin material exhibiting rubber elasticity such as a silicone rubber material, a thermoplastic elastomer or the like. Alternatively, the elastic member may be made of a resin material exhibiting low molding shrinkage, such as polyimide resin, epoxy resin, silicone resin or the like.

In accordance with another aspect of the present invention, a method for manufacturing a liquid crystal display panel inspection device is provided. The device includes a panel holder formed with a holding section constructed so as to be mounted therein with a liquid crystal display panel provided with electrodes, a printed circuit board arranged at a peripheral edge of the holding section of the panel holder and having electrodes formed thereon, connection wires each connected to one of the electrodes of the printed circuit board in a manner to elastically bendably extend to the holding section and provided at a distal end thereof with a terminal in a manner to be abuttable against one of the electrodes of the liquid crystal display panel, and an elastic member for sealing within each of the connection wires except each of the terminals thereof. The method comprises the steps of mounting a dummy panel including contact members corresponding to the electrodes of the liquid crystal display panel on the printed circuit board, bonding one end of each of the connection wires to a corresponding one of the contact members of the dummy panel and wire bonding the other end of each of the connection wires to a corresponding one of the electrodes of the printed circuit board, to thereby provide each of the terminals, providing the elastic member on the dummy panel and printed circuit board to seal the connection wires within the elastic member, and removing the dummy panel from the printed circuit board.

The method of the present invention thus constructed facilitates manufacturing of the device and ensures forming of the terminals at desired positions with increased accuracy, to thereby provide the device with high reliability.

In a preferred embodiment of the present invention, the method further comprises the steps of forming a resist layer all over one surface of the dummy panel, partially removing the resist layer to form openings which cause a surface of the dummy panel to be partially exposed, subjecting the dummy panel to etching on a side thereof on which the resist layer is formed to form recesses on an exposed portion of the dummy panel, and depositing metal in each of the recesses by electroforming to form each of the contact members constituting at least a part of each of the terminals. Such further steps may be practiced before or after mounting of the dummy panel on the printed circuit board.

Such construction permits the terminals to be formed with a desired configuration and size.

The dummy panel is formed so as to have at least a portion which is substantially identical in a configuration as in a plan view with the area including the electrodes of the liquid crystal display panel, or which corresponds to the electrode arrangement of the liquid crystal display panel. Removal of the dummy panel may be carried out by etching or the like. When removal of the dummy panel is to be carried out by etching, it may be made of any suitable etchable material such as copper or the like.

The elastic member may be formed by putting a frame-like jig on the dummy panel and printed circuit board and then pouring liquid resin into the jig, followed by curing of the resin.

BRIEF DESCRIPTION OF THE DRAWINGS

These and other objects and many of the attendant advantages of the present invention will be readily appreciated as the same becomes better understood by reference to the following detailed description when considered in connection with the accompanying drawings, in which like reference numerals designate like or corresponding parts throughout; wherein.

DETAILED DESCRIPTION OF THE PREFERRED EMBODIMENTS

Now, a liquid crystal display panel inspection device according to the present invention will be described with reference to the accompanying drawings.

Figure 1:
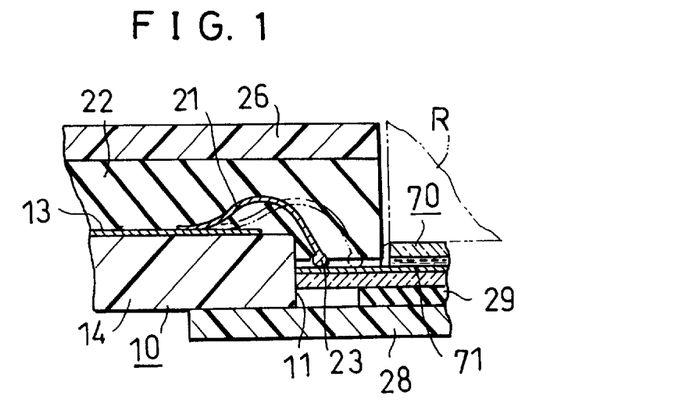
FIG. 1 is a fragmentary enlarged sectional view showing an essential part of an embodiment of a liquid crystal display panel inspection device according to the present invention.

Referring first to FIG. 1, an essential part of an embodiment of a liquid crystal display panel inspection device according to the present invention is illustrated. A liquid crystal display panel inspection device of the illustrated embodiment includes a panel holder 10 shaped into a configuration like a frame plate and formed with a mounting hole 11 acting as a mounting section. The mounting hole 11 is provided therein with a photo detector section R connected to a detection inspection circuit (not shown). Also, the mounting hole 11 is detachably mounted therein with a liquid crystal display panel 70 to be inspected in a manner to be opposite to the photo detector section R. The liquid crystal display panel 70, as is widely known in the art, includes transparent electrodes 71 together with polarizing plates, a liquid crystal layer, orientation layers, color filters, switching elements and the like which are arranged in a manner to be laminated on each other and has external connection electrodes arranged on at least one side thereof while being exposed in a step-like manner.

The panel holder 10 is constructed of at least one or a plurality of partition members 14 formed on one surface thereof with a plurality of electrodes 13 and connected to each other in a frame-like manner. The partition members 14 correspond to printed circuit boards. The mounting hole 11 described above is defined between the partition members 14. The partition members 14 are each made of an epoxy resin material, a ceramic material or the like and the electrodes 13 are formed on the partition members 14 by pattern printing or the like.

Of course, the illustrated embodiment may be constructed in such a manner that the panel holder 10 and printed circuit boards are made separately from each other and then assembled together.

Figure 3:
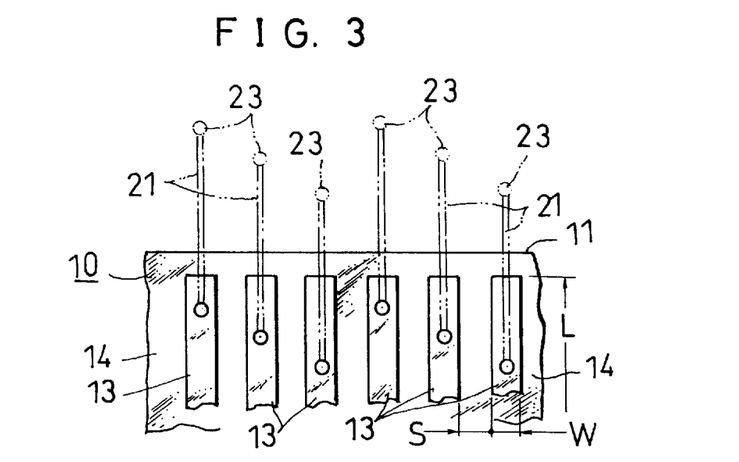
FIG. 3 is a schematic plan view of the essential part of the liquid crystal display panel inspection device shown in FIG. 2.

The electrodes 13 of the partition members 14 are arranged so as to correspond to the transparent electrodes 71 of the liquid crystal display panel 70, thus, the number of electrodes 13 arranged is the same as that of the transparent electrodes 71. The electrodes 13, as shown in FIG. 3, are arranged so as to be spaced from each other at predetermined intervals S while being kept parallel with each other. Supposing that connection wires described hereinafter each have a diameter of 25 μm, the electrodes 13 may be formed with a width W of about 80 μm or more and a length L of about 2 to 10 mm and arranged at intervals S of about 20 μm in conformity with pitches of the electrodes 71 of the liquid crystal display panel 70.

Figure 4:
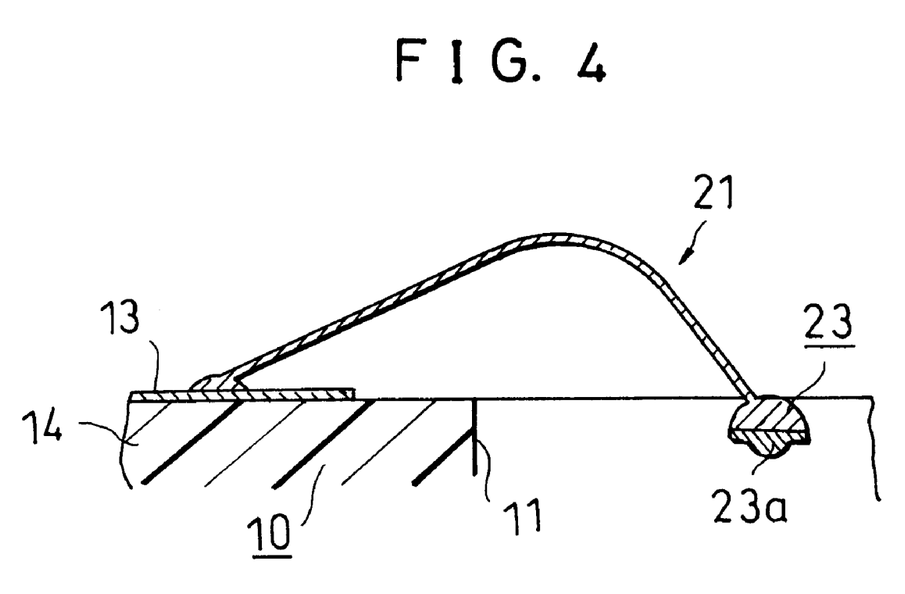
FIG. 4 is a fragmentary sectional view schematically showing another essential part of the liquid crystal display panel inspection device of FIG. 1.

Also, the panel holder 10 is provided on one surface thereof with connection wires 21, which are respectively connected to the electrodes 13 of the partition members 14 and sealedly held on the panel holder 10 by means of a sealing rubber member 22 which is formed so as to exhibit elasticity. Each of the connection wires 21, as shown in FIGS. 3 and 4, is bonded at one end thereof to one of the respective electrodes 13 of the partition members 14 in an offset or staggered manner. Also, the connection wires 21 are each bent at a central portion thereof into a dog-legged shape so as to be elastically bendable and arranged so as to extend into the mounting hole 11. Further, the connection wires 21 are each formed at the other end thereof with a terminal 23 of a substantially spherical shape in a manner to be abuttable against one of the electrodes 71 of the liquid crystal display panel 70. The terminals 23 of the connection wires 21 are also arranged in an offset manner. The connection wires 21 may each be made of a fine wire material of gold or the like, which permits the wire 21 to be subjected to wire bonding. Each of the terminals 23, as described hereinafter, includes a contact portion 23a made of hard metal such as nickel or the like, which is arranged so as to project from the sealing rubber member 22, resulting in the contact portion 23a being abuttable against one of the electrodes 71 of the liquid crystal display panel 70.

The sealing rubber member 22 may be made of an insulating material which exhibits rubber elasticity, such as silicone rubber, thermoplastic elastomer or the like. The sealing rubber member 22 is fixed on a surface of the partition members 14 to seal within portions of the connection wires 21 except the terminals 23. The sealing rubber member 22 is integrally elastically deformed so as to permit the connection wires 21 to bend. The sealing rubber member 22 has a reinforcing plate 26 attached thereto, which may be made of a resin material or a metal material such as aluminum.

The panel holder 10 is detachably mounted on the other surface thereof with a holding plate 28 using any suitable system of fits and fixing means such as screws or the like. The holding plate 28 is made of resin or metal and provided on an inner surface thereof or a surface thereof facing the panel holder 10 with an elastic member 29 such as a silicone rubber member, a thermoplastic elastomer member or the like. The holding plate 28 functions to hold the liquid crystal display panel 70 mounted in the mounting hole 11 to force it toward the terminals 23 of the connection wires 21 through the elastic member 29 while being mounted on the panel holder 10.

The holding plate 28 may be mounted on the panel holder 10 by means of a hinge or the like and the elastic member 29 may be constructed of a coiled spring or a leaf spring.

Now, the manner of assembling of the liquid crystal display panel inspection device of the illustrated embodiment constructed as described above will be described hereinafter.

The liquid crystal display panel 70 to be inspected is mounted in the mounting hole 11 of the panel holder 10 from one side of the panel holder 10 or from below and then the holding plate 28 is mounted on the panel holder 10 to securely hold the liquid crystal display panel 70 on the panel holder 10. This causes the elastic member 29 to force the liquid crystal display panel 70 toward the one surface of the panel holder 10 or toward the connection wires 21, resulting in the electrodes 71 of the liquid crystal display panel 70 being abutted against the terminals 23 of the connection wires 21, so that the electrodes 71 of the liquid crystal display panel 70 may be connected through the connection wires 21 to the electrodes 13 of the partition members 14. This permits a final inspection of the liquid crystal display panel in each of the steps in manufacturing the liquid crystal display panel to be satisfactorily accomplished.

The liquid crystal display panel inspection device of the illustrated embodiment is so constructed that the connection wires 21 are each formed with a reduced diameter and abutted at the terminal 23 thereof against one of the electrodes 71 of the liquid crystal display panel 70. Such construction permits intervals between the connection wires 21 to be significantly reduced, so that the inspection device of the illustrated embodiment may be effectively applied to the liquid crystal display panel 70 even when the electrodes 71 are arranged at reduced pitches. Also, such construction significantly reduces a manufacturing cost of the inspection device because it does not require any spring probe. In particular, in the illustrated embodiment, the connection wires 21 are connected to the respective electrodes 13 of the partition members 14 in an offset or staggered manner and the terminals 23 of the connection wires 21 are brought into contact with the respective electrodes 71 of the liquid crystal display panel 70 while being arranged in an offset or staggered manner, so that the illustrated embodiment may be effectively applied to the liquid crystal display panel 70 even when the electrodes 71 are arranged at further reduced pitches.

Now, the manner of manufacturing the liquid crystal display panel inspection device of the illustrated embodiment thus constructed will be described hereinafter.

Figure 5A:
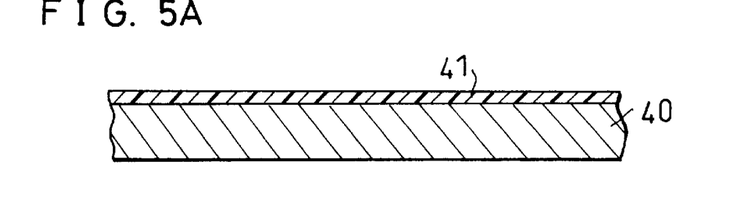
FIGS. 5A to 5F are schematic sectional views showing steps in manufacturing of a liquid crystal display panel inspection device according to the present invention in a time-sequential manner.

First, a dummy panel 40 is prepared. More particularly, the dummy panel 40 is made of an etchable material such as copper or the like. The dummy panel 40 is formed so as to have at least a portion which is substantially identical in a configuration as in a plan view with the area including electrodes 71 of the liquid crystal display panel 70, or which corresponds to the electrode arrangement of the liquid crystal display panel 70. In the illustrated embodiment, the dummy panel 40 may be formed with substantially the same configuration as a portion of the liquid crystal display panel 70 on a side of which the electrodes 71 are disposed. Then, as shown in FIG. 5A, a resist layer 41 is formed all over one surface of the dummy panel 40. It is not necessarily required to form the dummy panel 40 with the same shape as in a plan view as the liquid crystal display panel 70, however, the dummy panel 40 of the same shape facilitates manufacturing of the inspection device.

Figure 5B:
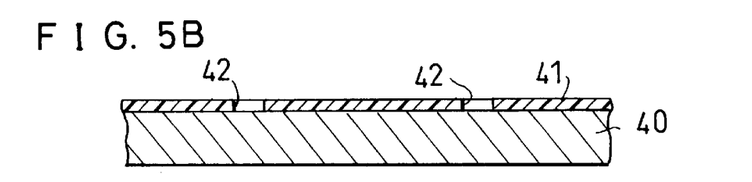
Figure 5C:
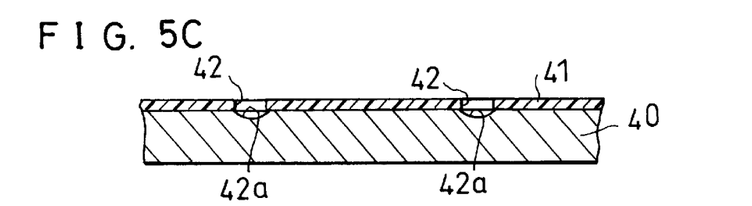

Then, as shown in FIG. 5B, the resist layer 41 of the dummy panel 40 is subjected to a photosensitizing treatment, to thereby be formed with a plurality of openings 42 in an offset manner at the same pitches as the electrodes 71 of the liquid crystal display panel 70. Subsequently, as shown in FIG. 5C, the dummy panel 40 is subjected on a resist layer side thereof to etching, so that portions of the dummy panel 40 exposed through the openings 42 are each formed with a recess 42a of which a bottom is formed into a substantially hemispherical shape. For example, supposing that pitches between the electrodes 71 of the liquid crystal display panel 70 to be inspected are 50 $\mu$m, the recesses 42a may each be formed with a substantially hemispherical shape having an opening of 25 $\mu$m or less in diameter $D_1$ or a shape corresponding to a part of a spherical shape having an opening of the same diameter, to thereby ensure point-contact between each of the terminals 23 and each corresponding one of the electrodes 71 of the liquid crystal display panel 70.

Figure 5D:
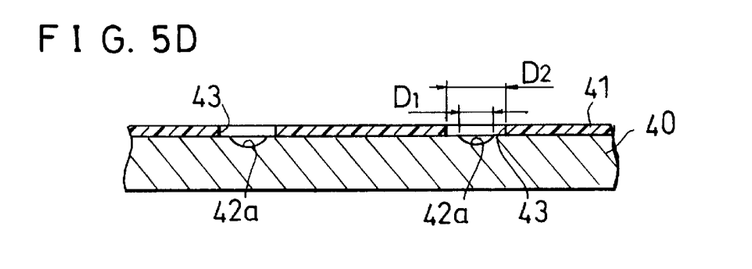
Figure 5E:
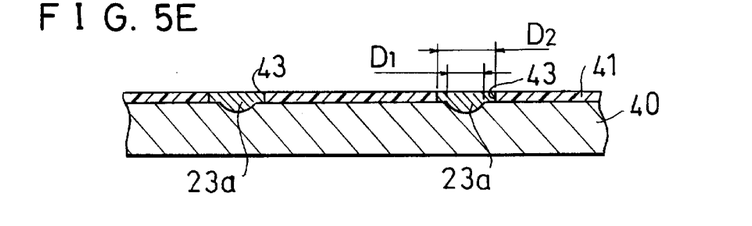
Figure 5F:
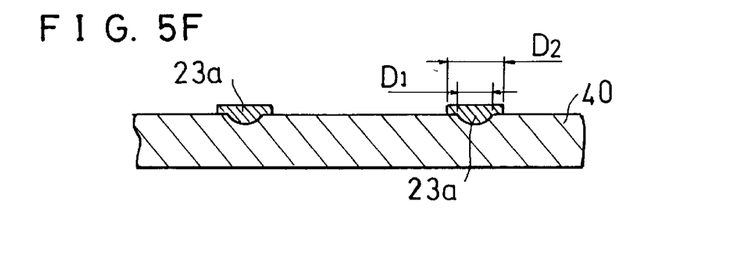

Thereafter, as shown in FIG. 5D, the resist layer 41 of the dummy panel 40 is subjected to a photosensitizing treatment again, resulting in each of the openings 42 being enlarged into an opening 43 of a larger diameter. The opening 43 is formed with a diameter $D_2$ as large as 50 $\mu$m or more in order to facilitate wire bonding of the connection wire 21. Then, as shown in FIG. 5E, electroforming of hard conductive metal such as nickel or the like is carried out in each of the openings 43 of the dummy panel 40 to form the contact portion 23a constituting at least a part of the terminal 23, followed by removal of the resist layer 41 (FIG. 5F).

Figure 2:
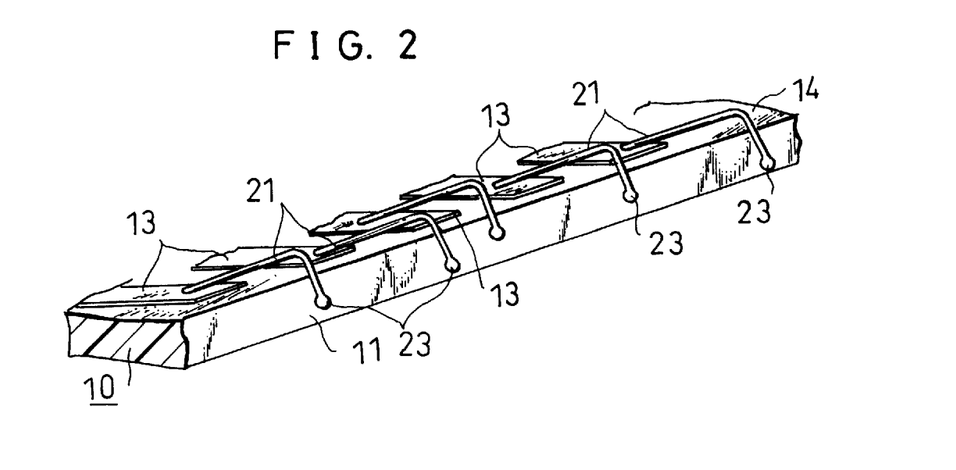
FIG. 2 is a fragmentary enlarged perspective view schematically showing the essential part of the liquid crystal display panel inspection device of FIG. 1.
Figure 6A:
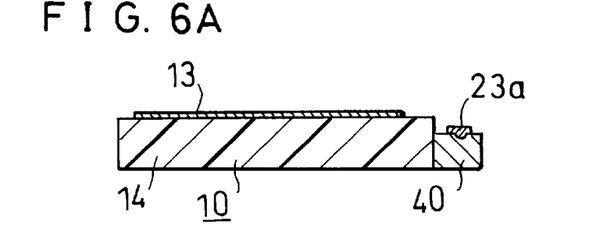
FIGS. 6A to 6D are schematic sectional views showing steps subsequent to those of FIGS. 5A to 5F in manufacturing of a liquid crystal display panel inspection device according to the present invention in a time-sequential manner.
Figure 6B:
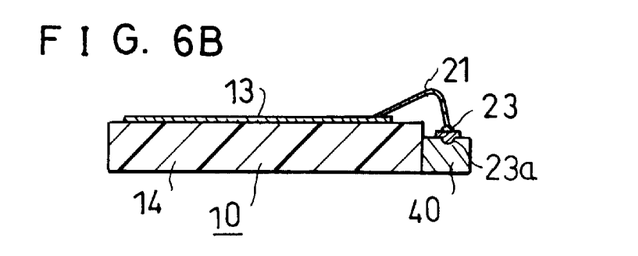
Figure 6C:
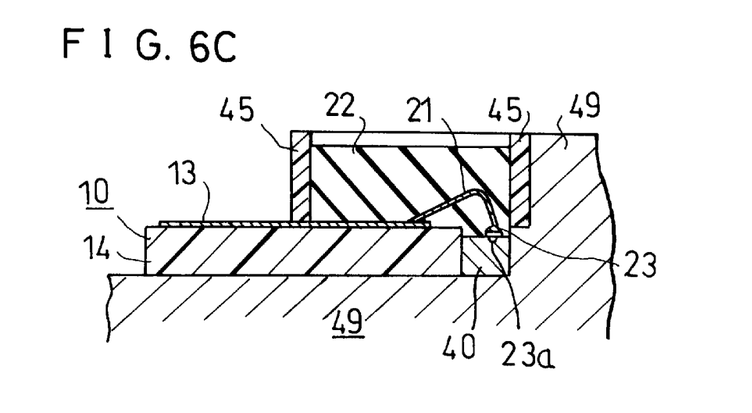

Subsequently, as shown in FIG. 6A, the dummy panel 40 treated as described above is mounted on the panel holder 10 and then wire bonding of the connection wires 21 to the respective electrodes 13 of the panel holder 10 and the respective contact portions 23a of the dummy panel 40 is carried out in order while bending each of the connection wires 21 into a dog-legged shape (FIG. 6B). Connection of the connection wires 21 to the electrodes 13 is carried out in an offset manner (FIGS. 2 and 3). Then, as shown in FIG. 6C, a frame member 45 is arranged on the dummy panel 40 and panel holder 10 to surround the connection wires 21, followed by pouring of a liquid elastic material into the frame member 45. Thereafter, the elastic material is cured to provide the sealing rubber member 22 and then the frame member 45 is removed. Reference numeral 49 designates a support jig.

Figure 6D:
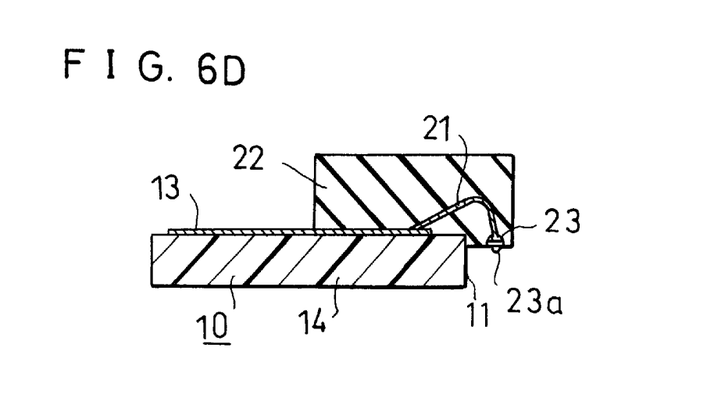

Then, the reinforcing plate 26 is fixed on the sealing rubber member 22 of the panel holder 10 and then the panel holder 10 is mounted on a body (not shown) of the device, followed by connection of the electrodes 13 of the panel holder 10 to an inspection circuit or the like.

In manufacturing of the liquid crystal display panel inspection device described above, the dummy panel 40 is mounted on the panel holder 10 or the partition members 14 which are assembled. Alternatively, the steps extending from mounting of the dummy panel 40 to forming of the sealing rubber member 22 may be carried out before assembling of the partition members 14, followed by assembling of the partition members 14 to provide the panel holder 10.

Also, the liquid crystal display panel inspection device of the illustrated embodiment may be used for inspection while keeping the frame member 45 incorporated therein, that is, without removing it from the device.

Further, in the illustrated embodiment, the contact portion 23a made of hard metal by electroforming is provided. However, the contact portion 23a is not necessarily required. Alternatively, enlargement of the end of each of the connection wires 21 by ball bonding or the like may be substituted for providing the contact portion 23a.

Figure 7:
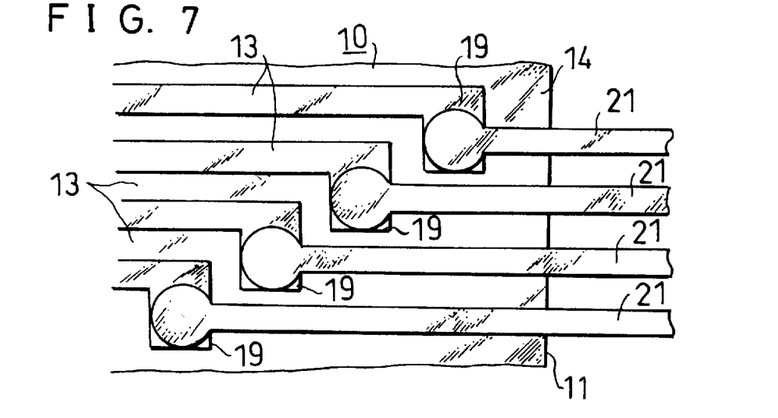
FIG. 7 is a fragmentary enlarged schematic plan view showing another embodiment of a liquid crystal display panel inspection device according to the present invention.

Referring now to FIG. 7, an essential part of another embodiment of a liquid crystal display panel inspection device according to the present invention is illustrated in an enlarged scale. In a liquid crystal display panel inspection device of the illustrated embodiment, electrodes 13 of a panel holder 10 (or partition members 14) are each formed with an enlarged portion 19 increased in width and arranged in a step-like manner, wherein the enlarged portions 19 of the electrodes 13 are each bonded to an end of one of connection wires 21.

The illustrated embodiment is advantageously applied when the electrodes 13 of the panel holder 10 are formed with a width below a level (in general, at least about 100 $\mu$m) required for wire bonding. More particularly, a decrease in pitches between the electrodes 13 to a degree that causes a width of the electrodes 13 to be reduced renders bonding of the connection wires 21 difficult. Forming of the enlarged portion 19 on each of the electrodes 13 facilitates bonding of the connection wires 21.

In general, electrodes 71 of a liquid crystal display panel 70 are each formed with a width below 100 $\mu$m. Therefore, when such an electrode pattern as shown in FIG. 7 is employed for the electrodes 71 of the liquid crystal display panel 70 to be inspected and terminals 23 of the connection wires 21 are arranged so as to be abuttable against the respective electrodes 71 of such a pattern, the inspection may be accomplished with increased reliability.

Figure 8A:
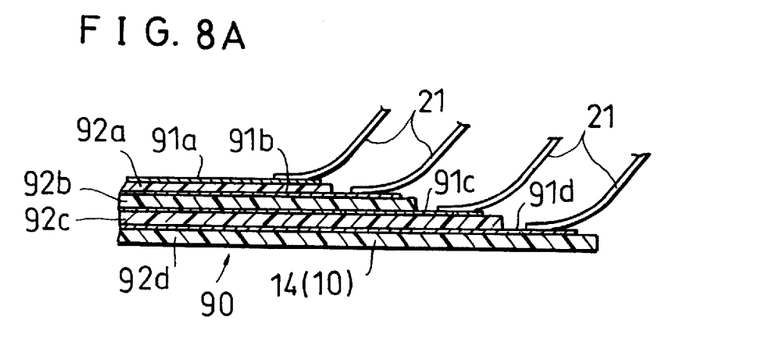
FIG. 8A is a fragmentary enlarged front elevation view in section showing a further embodiment of a liquid crystal display panel inspection device according to the present invention.
Figure 8B:
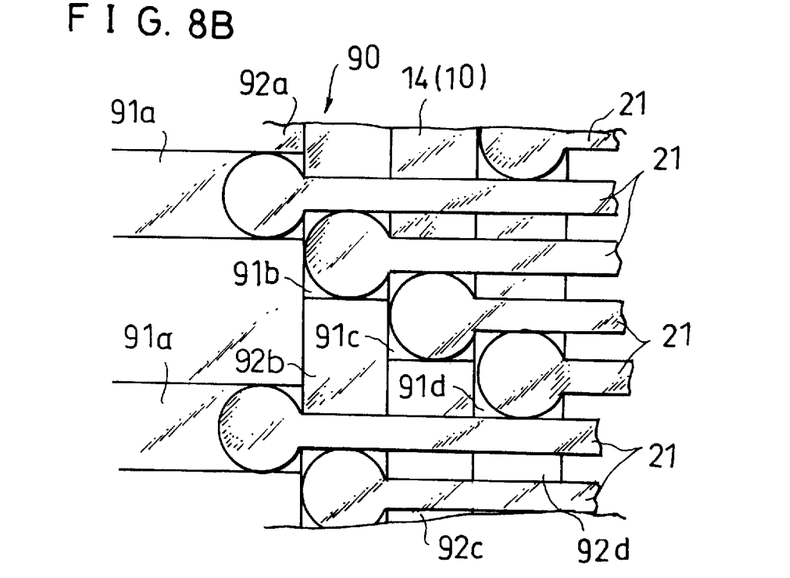
FIG. 8B is a fragmentary plan view of the liquid crystal display panel inspection device of FIG. 8A.

Referring now to FIGS. 8A and 8B, a further embodiment of a liquid crystal display panel inspection device according to the present invention is illustrated. In a liquid crystal display panel inspection device of the illustrated embodiment, a panel holder 10 (partition members 14) is constructed of a multi-layer substrate or board 90 having electrodes 91a to 91d and insulating layers 92a to 92d laminated thereon in order. The multi-layer board 90 is so constructed that the electrodes 91a to 91d on the respective layers are exposedly arranged in a step-like and offset manner on one side of the board 90 and connection wires 21 are respectively connected to the electrodes 91a to 91d by bonding.

Thus, in the liquid crystal display panel inspection device of the illustrated embodiment, the multi-layer board 90 is constructed so as to permit the electrodes 91a to 91d to be vertically and laterally deviated from each other in order, so that the connection wires 21 may be connected to the respective electrodes 91a to 91d at reduced intervals. Thus, the illustrated embodiment may be effectively applied to inspection of a liquid crystal display panel even when electrodes of the panel are arranged at fine pitches.

In the illustrated embodiment, a plurality of single-layer or multi-layer boards laminated together may be substituted for the multi-layer board 90.

Figure 9:
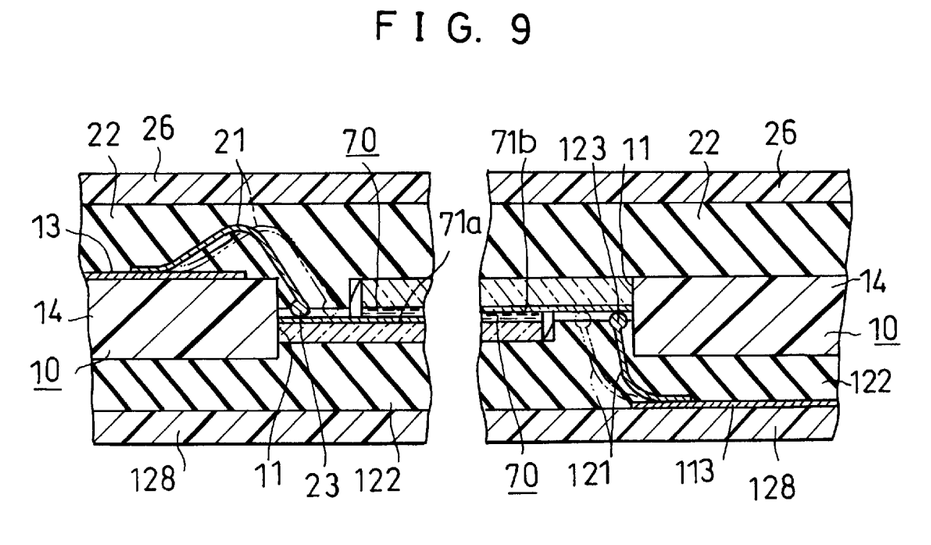
FIG. 9 is a fragmentary elevation view in section showing still another embodiment of a liquid crystal display panel inspection device according to the present invention.

Referring now to FIG. 9, an essential part of still another embodiment of a liquid crystal display panel inspection device according to the present invention is illustrated. An inspection device of the illustrated embodiment is adapted to be applied to inspection of a liquid crystal display panel 70 in which electrodes 71a and 71b are exposed on upper and lower surfaces thereof. More particularly, the liquid crystal display panel inspection device of the illustrated embodiment is so constructed that a plurality of connection wires 21 are arranged on one side of a mounting hole 11 of a panel holder 10 and then sealed within by a sealing rubber member 22. The sealing rubber member 22 is continuously formed all over one surface of the panel holder 10 or an upper surface thereof to close one open side of the mounting hole 11. Also, a holding plate 128 is arranged on the other surface of the panel holder 10 so as to selectively open the other open side of the mounting hole 11 and formed thereon with a plurality of electrodes 113. Connection wires 121 are each connected at one end thereof to one of the electrodes 113 in an offset manner and sealed within by a sealing rubber member 122, so that the sealing rubber member 122 forces the liquid crystal display panel 70 toward the one surface of the panel holder 10 or the connection wires 21.

Also, in the illustrated embodiment, the connection wires 121 each have a terminal 123 arranged on a side of the other surface of the panel holder 10, so that, while the terminals 23 are each abutted against one of the electrodes 71a of the liquid crystal display panel 70 on the one surface thereof, the terminals 123 of the connection wires 121 on the holding plate 128 are each abutted against one of the electrodes 71b of the liquid crystal display panel 70 on the other surface thereof. Thus, the illustrated embodiment permits inspection of the liquid crystal display panel 70 having the electrodes 71a and 71b arranged on both surfaces thereof to be facilitated.

In the illustrated embodiment, a photo detector section R is omitted from FIG. 9. The photo detector section R may be arranged by partially removing the sealing rubber member 22 from the panel holder 10.

In each of the embodiments described above, the sealing rubber member 22 or 122 of a single layer structure is used for sealing within the connection wires 21 or 121. Alternatively, the sealing rubber member 22 or 122 may be constructed of a plurality of rubber layers different in modulus of elasticity from each other, to thereby provide desired flexibility.

As can be seen from the foregoing, the liquid crystal display panel inspection device of the present invention eliminates arrangement of inherently expensive spring probes, to thereby reduce a manufacturing cost of the device, and it significantly reduces intervals or pitches between the connection wires, to thereby facilitate inspection of a liquid crystal display panel reduced in electrode pitches.

Also, the device of the present invention permits connection of the connection wires to be accomplished at reduced intervals, to thereby facilitate inspection of a liquid crystal display panel further reduced in electrode pitches.

Further, the method of the present invention facilitates manufacturing of the liquid crystal display panel inspection device and ensures forming of the terminals at desired positions with increased accuracy, to thereby provide the device with high reliability.

Moreover, the method of the present invention permits the terminals to be formed with a desired configuration and size.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A liquid crystal display panel inspection device comprising:
   a panel holder formed with a holding section constructed so as to be mounted therein with a liquid crystal display panel provided with electrodes;
   at least one printed circuit board arranged at a peripheral edge of said holding section of said panel holder and having electrodes formed thereon;
   connection wires each connected to one of said electrodes of said printed circuit board in a manner to elastically bendably extend to said holding section and provided at a distal end thereof with a terminal in a manner to be abuttable against one of the electrodes of the liquid crystal display panel; and
   an elastic member for sealing within each of said connection wires except each of said terminals thereof.

2. A liquid crystal display panel inspection device as defined in claim 1, wherein said printed circuit board comprises a multi-layer board having a plurality of electrodes laminated thereon to constitute said electrodes of said printed circuit board;
   said electrodes on layers of said multi-layer board being exposed in a step-like manner on one side of said multi-layer board;
   said electrode on each of said layers being connected at an exposed portion thereof to one of said connection wires.

3. A liquid crystal display panel inspection device as defined in claim 1, wherein said connection wires are each connected at an end thereof in an offset manner to said printed circuit board.

4. A liquid crystal display panel inspection device as defined in claim 2, wherein said connection wires are each connected at an end thereof in an offset manner to said printed circuit board.

5. A liquid crystal display panel inspection device as defined in claim 1, further comprising a holding plate detachably mounted on said panel holder to force the liquid crystal display panel toward said terminals of said connection wires.

6. A liquid crystal display panel inspection device as defined in claim 2, further comprising a holding plate detachably mounted on said panel holder to force the liquid crystal display panel toward said terminals of said connection wires.

7. A liquid crystal display panel inspection device as defined in claim 5, wherein said holding plate is provided on an inner surface thereof with a second elastic member adapted to abut with the liquid crystal display panel.

8. A liquid crystal display panel inspection device as defined in claim 6, wherein said holding plate is provided on an inner surface thereof with a second elastic member adapted to abut with the liquid crystal display panel.

9. A liquid crystal display panel inspection device as defined in claim 7, wherein said holding plate includes second electrodes formed thereon and second connection wires each connected to one of said second electrodes in a manner to elastically bendably extend to said holding section and provided at a distal end thereof with a second terminal in a manner to be abuttable against one of the electrodes of the liquid crystal display panel, and said second elastic member seals within each of said second connection wires except each of said second terminals thereof.

10. A liquid crystal display panel inspection device as defined in claim 8, wherein said holding plate includes second electrodes formed thereon and second connection wires each connected to one of said second electrodes in a manner to elastically bendably extend to said holding section and provided at a distal end thereof with a second terminal in a manner to be abuttable against one of the electrodes of the liquid crystal display panel, and said second elastic member seals within each of said second connection wires except each of said second terminals thereof.

11. A liquid crystal display panel inspection device as defined in claim 1, wherein said electrodes of said printed circuit board are each formed into a strip-like shape having an enlarged portion increased in width and arranged in a step-like manner, at which enlarged portion one of said connection wires is connected to one of said electrodes of said printed circuit board.

12. A liquid crystal display panel inspection device as defined in claim 3, wherein said electrodes of said printed circuit board are each formed into a strip-like shape having an enlarged portion increased in width and arranged in a step-like manner, at which enlarged portion one of said connection wires is connected to one of said electrodes of said printed circuit board.

13. A liquid crystal display panel inspection device as defined in claim 1, wherein each of said terminals of said connection wires includes a contact portion made of hard metal and adapted to abut against said one of the electrodes of the liquid crystal display panel.

14. A liquid crystal display panel inspection device as defined in claim 2, wherein each of said terminals of said connection wires includes a contact portion made of hard metal and adapted to abut against said one of the electrodes of the liquid crystal display panel.

15. A liquid crystal display panel inspection device as defined in claim 1, wherein said terminals of said connection wires are arranged in an offset manner.

16. A liquid crystal display panel inspection device as defined in claim 2, wherein said terminals of said connection wires are arranged in an offset manner.

17. A method for manufacturing a liquid crystal display panel inspection device including a panel holder formed with a holding section constructed so as to be mounted therein with a liquid crystal display panel provided with electrodes, at least one printed circuit board arranged at a peripheral edge of the holding section of the panel holder and having electrodes formed thereon, connection wires each connected to one of the electrodes of the printed circuit board in a manner to elastically bendably extend to the holding section and provided at a distal end thereof with a terminal in a manner to be abuttable against one of the electrodes of the liquid crystal display panel, and an elastic member for sealing within each of the connection wires except each of the terminals thereof, comprising the steps of:

mounting a dummy panel including contact members corresponding to the electrodes of the liquid crystal display panel on said printed circuit board;

bonding one end of each of said connection wires to a corresponding one of said contact members of said dummy panel and wire bonding the other end of each of said connection wires to a corresponding one of said electrodes of said printed circuit board, to thereby provide each of said terminals;

providing said elastic member on said dummy panel and printed circuit board to seal said connection wires within said elastic member; and removing said dummy panel from said printed circuit board.

18. A method as defined in claim 17, wherein said printed circuit board comprises a multi-layer board having a plurality of electrodes laminated thereon to form said electrodes of said printed circuit board;

said electrodes on layers of said multi-layer board being exposed in a step-like manner on one side of said multi-layer board;

said electrode on each of said layers being connected at an exposed portion thereof to one of said connection wires.

19. A method as defined in claim 17, wherein said connection wires are each connected at an end thereof in an offset manner to said printed circuit board.

20. A method as defined in claim 18, wherein said connection wires are each connected at an end thereof in an offset manner to said printed circuit board.

21. A method as defined in claim 19, wherein said terminals of said connection wires are arranged in an offset manner.

22. A method as defined in claim 20, wherein said terminals of said connection wires are arranged in an offset manner.

23. A method as defined in claim 17, further comprising the steps of:

forming a resist layer all over one surface of said dummy panel;

partially removing said resist layer to form openings which cause a surface of said dummy panel to be partially exposed;

subjecting said dummy panel to etching on a side thereof on which said resist layer is formed to form recesses on an exposed portion of said dummy panel; and depositing metal in each of said recesses by electroforming to form each of said contact members constituting at least a part of said terminals.

* * * * *

UNITED STATES PATENT AND TRADEMARK OFFICE
CERTIFICATE OF CORRECTION

PATENT NO. : 5,933,018
DATED : August 3, 1999
INVENTOR(S) : Komatsu

It is certified that error appears in the above-identified patent and that said Letters Patent is hereby corrected as shown below:

Cover Page, [54], "LIQUID CRYSTAL DISPLAY PANEL INSPECTION DEVICE AND METHOD FOR MANUFACTURING SAME" should read --MOUNTING A LCD PANEL FOR INSPECTION AND TESTING USING TEMPORARY ELECTRICAL CONNECTIONS MADE BY ELASTIC PRESSURE--

Cover Page, [75], "Omiya," should read --Omiya-Shi--

Signed and Sealed this
First Day of February, 2000

Attest:

Attesting Officer

Q. TODD DICKINSON
Acting Commissioner of Patents and Trademarks